US010236852B2

(12) United States Patent
Schultz et al.

(10) Patent No.: US 10,236,852 B2
(45) Date of Patent: Mar. 19, 2019

(54) PARALLEL LC RESONATOR AND METHOD THEREFOR

(71) Applicant: NXP USA, INC., Austin, TX (US)

(72) Inventors: Joseph Gerard Schultz, Wheaton, IL (US); Hussain Hasanali Ladhani, Tempe, AZ (US); Enver Krvavac, Kildeer, IL (US); Yu-Ting Wu, Schaumburg, IL (US)

(73) Assignee: NXP USA, INC., Austin, TX (US)

( * ) Notice: Subject to any disclaimer, the term of this patent is extended or adjusted under 35 U.S.C. 154(b) by 19 days.

(21) Appl. No.: 15/373,953

(22) Filed: Dec. 9, 2016

(65) Prior Publication Data

US 2018/0167047 A1    Jun. 14, 2018

(51) Int. Cl.
| | |
|---|---|
| *H03H 7/01* | (2006.01) |
| *H01G 4/38* | (2006.01) |
| *H01F 27/28* | (2006.01) |
| *H03H 1/00* | (2006.01) |
| *H01L 23/522* | (2006.01) |
| *H01L 23/00* | (2006.01) |
| *H01G 4/33* | (2006.01) |

(52) U.S. Cl.
CPC ....... *H03H 7/0115* (2013.01); *H01F 27/2823* (2013.01); *H01G 4/33* (2013.01); *H01G 4/38* (2013.01); *H01L 23/5222* (2013.01); *H01L 24/48* (2013.01); *H03H 1/00* (2013.01); *H03H 7/1766* (2013.01); *H03H 7/1775* (2013.01); *H01F 2027/2814* (2013.01); *H01L 24/45* (2013.01); *H01L 2224/04042* (2013.01); *H01L 2224/45124* (2013.01); *H01L 2224/45139* (2013.01); *H01L 2224/45144* (2013.01); *H01L 2224/45147* (2013.01); *H01L 2224/4813* (2013.01); *H01L 2224/4847* (2013.01); *H01L 2224/48091* (2013.01); *H01L 2224/48463* (2013.01); *H01L 2924/10253* (2013.01); *H01L 2924/10329* (2013.01); *H01L 2924/19042* (2013.01)

(58) Field of Classification Search
CPC .. H03H 7/0115; H03H 7/1766; H03H 7/1775; H01G 4/38; H01F 27/2823
USPC .............. 361/301.1, 175, 185; 333/175, 185, 333/301.1
See application file for complete search history.

(56) References Cited

U.S. PATENT DOCUMENTS

| | | | |
|---|---|---|---|
| 4,419,713 A | 12/1983 | Levinson | |
| 6,590,473 B1 * | 7/2003 | Seo | H01L 27/08 257/E27.046 |
| 9,331,642 B2 | 5/2016 | Musa et al. | |
| 2004/0233092 A1 | 11/2004 | Hong | |
| 2007/0069835 A1 | 3/2007 | Kamgaing | |

(Continued)

FOREIGN PATENT DOCUMENTS

WO    2015190375 A1    12/2015

*Primary Examiner* — Rakesh B Patel

(57) ABSTRACT

An integrated circuit (IC) includes an input pad and an output pad separated from the input pad by a predetermined distance. A plurality of capacitors are coupled in series between the input pad and the output pad. The plurality of capacitors are distributed to substantially span the predetermined distance. An inductor is formed from a bond wire, having a first end attached at the first input pad and a second end attached at the output pad. The inductor and plurality of capacitors configured to form a predetermined open circuit resonance.

19 Claims, 2 Drawing Sheets

(56) References Cited

U.S. PATENT DOCUMENTS

| | | | |
|---|---|---|---|
| 2010/0020469 A1* | 1/2010 | Kurioka | H01G 4/018 361/321.1 |
| 2012/0126887 A1* | 5/2012 | Han | H03F 1/0277 330/53 |
| 2013/0187712 A1 | 7/2013 | Cabanillas et al. | |
| 2014/0118881 A1* | 5/2014 | Kim | H01G 4/306 361/301.4 |
| 2014/0354371 A1* | 12/2014 | Tsai | H03H 7/48 333/131 |
| 2015/0180437 A1* | 6/2015 | Zuo | H03H 7/0115 333/185 |
| 2015/0380478 A1* | 12/2015 | Levy | H01L 28/87 257/532 |
| 2015/0381140 A1 | 12/2015 | Embar et al. | |

* cited by examiner

PARALLEL LC RESONATOR AND METHOD THEREFOR

BACKGROUND

Field

This disclosure relates generally to radio frequency (RF) electronic components, and more specifically, to parallel LC resonators for use with electronic components.

Related Art

Today, radio frequency (RF) systems are used to provide wireless communication, for example, for cellular telephony, wireless data networks, and radio systems. RF systems may include power amplifiers which are coupled with resonant LC tanks circuits used in both series and parallel configurations to trap certain frequencies. Such tank circuits may be tuned to terminate and isolate the power amplifier harmonic impedances. However, challenges remain with parasitic effects impacting the accuracy of achieving resonance and overall efficiency of the power amplifier.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a parallel LC resonant tank circuit and method therefor. The inductive and capacitive components of the LC resonator have values tuned to a desired resonance. An inductor is formed from a bond wire coupled to an input pad and an output pad separated from the input pad by a predetermined distance. A plurality of capacitors are coupled in series between the input pad and output pad forming a parallel LC arrangement. The series capacitors are distributed to substantially span the predetermined distance. By arranging the capacitors in series, each capacitor can be physically larger thus minimizing parasitic effects and achieving resonance with greater accuracy.

Figure 1:
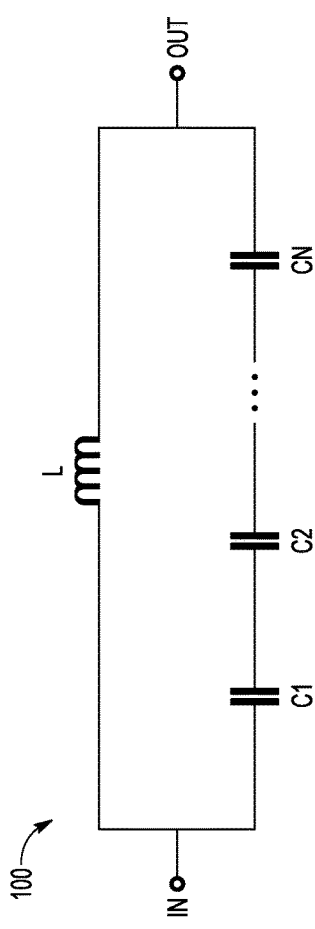
FIG. 1 illustrates, in schematic diagram form, an exemplary parallel LC resonator in accordance with an embodiment of the present disclosure.

FIG. 1 illustrates, in schematic diagram form, an exemplary parallel LC resonator circuit 100 in accordance with an embodiment of the present disclosure. Resonator circuit 100 may be coupled to a power amplifier output and tuned to wave-shape the output signal improving overall efficiency. Resonator circuit 100 may also be referred to as resonant tank circuit, capable of trapping a $3^{rd}$ harmonic frequency of an output signal, for example. In this embodiment, LC resonator circuit 100 is formed as an integrated passive device (IPD) fabricated using semiconductor process technology on a common substrate. The topology depicted in the exemplary parallel LC resonator circuit 100 of FIG. 1 includes an input terminal labeled IN, an output terminal labeled OUT, and between the IN and OUT terminals, an inductor L coupled in parallel with a series of capacitors C1-CN, where N is the number of series connected capacitors. A first terminal of inductor L is coupled to the IN terminal and a second terminal of inductor L is coupled to the OUT terminal. The series of capacitors C1-CN includes first capacitor C1 having a first terminal coupled to the IN terminal and a second terminal coupled to a first terminal of second capacitor C2. A second terminal of second capacitor C2 is coupled to a terminal of a next capacitor and so on until last capacitor CN having a first terminal coupled to a terminal of a previous capacitor and a second terminal coupled to the OUT terminal. In this embodiment, capacitors C1-CN are formed as metal-insulator-metal (MIM) capacitors. The number of series connected capacitors N is chosen in part based on desired frequency of the resonator. The inductor L is formed from bonding wire and has a length and diameter chosen based on desired frequency of the resonator.

Figure 2:
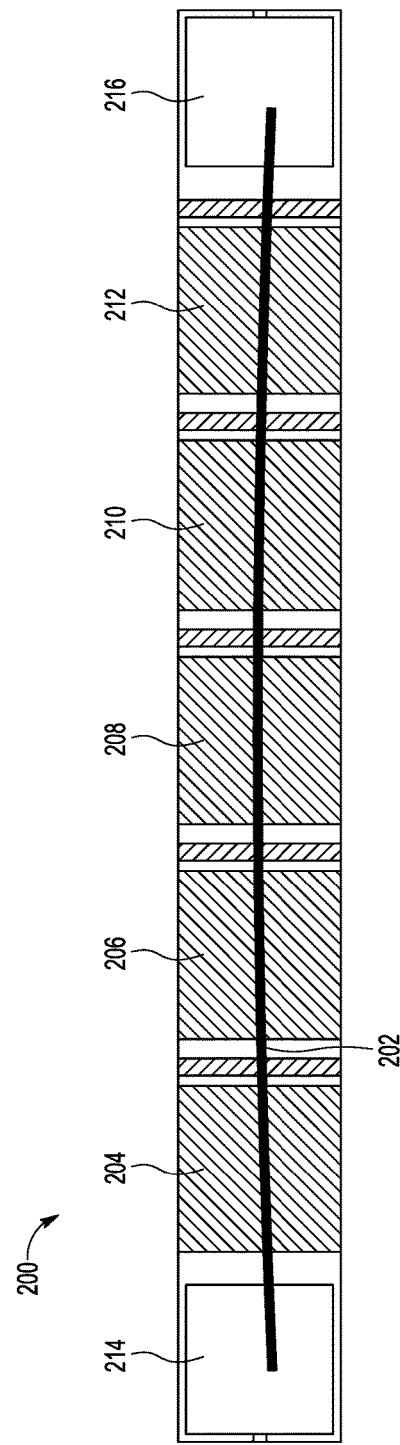
FIG. 2 illustrates, in a plan view, parallel LC resonator in accordance with an embodiment of the present disclosure.

FIG. 2 illustrates, in a plan view, exemplary parallel LC resonator layout 200 in accordance with an embodiment of the present disclosure. Resonator layout 200 depicts an exemplary implementation of the LC resonator circuit 100 of FIG. 1. Resonator layout 200 includes inductor 202 formed from a bond wire coupled in parallel with a series connected plurality of capacitors (204-212) on a common substrate. A first end of the bond wire is attached at first bonding pad 214 corresponding to input terminal IN and a second end of the bond wire is attached at second bonding pad 216 corresponding to output terminal OUT. The bond wire may be attached to bonding pads with either ball bonds or wedge bonds or a combination of ball bonds and wedge bonds. Bond wire of inductor 202 may be formed from any suitable conductive material such as aluminum, copper, silver, gold, and alloys thereof. Bond wire of inductor 202 may have a diameter in a range of 0.5 mils to 2.0 mils. Inductor 202 may be formed having any span distance and loop height, corresponding to a desired inductance value. The term span distance, as used herein, refers to a straight line distance measured approximately from a first attachment location of the bond wire at the first bonding pad 214 to a second attachment location of the bond wire at the second bonding pad 216. The term loop height, as used herein, generally refers to a height distance measured approximately from a top metal layer of the resonator (e.g., FIG. 3) to a highest point of the bond wire arc or loop above the top metal layer. For example, it may be desirable for inductor 202 to have an inductance value of 1.4 nanohenrys (nH). To achieve the value of 1.4 nH, an aluminum bond wire will have a diameter of approximately 1.5 mils, a span distance of approximately 35 mils, and a loop height of approximately 30 mils.

The plurality of capacitors includes five capacitors 204-212 connected in series, and arranged and distributed to substantially span the distance between the first attachment location and the second attachment location. A first terminal of capacitor 204 is connected at bonding pad 214 (IN terminal) and a second terminal of capacitor 204 is connected to a first terminal of capacitor 206. A second terminal of capacitor 206 is connected to a first terminal of capacitor 208 and a second terminal of capacitor 208 is connected to a first terminal of capacitor 210. A second terminal of capacitor 210 is connected to a first terminal of capacitor 212 and a second terminal of capacitor 212 is connected at bonding pad 216 (OUT terminal). Because five substantially similar sized capacitors 204-212 are connected in series, an equivalent capacitance between the first bonding pad 214 and the second bonding pad 216 may be substantially one-fifth of the capacitance of the individual capacitors of the plurality. For example, to achieve a desired equivalent capacitance value of 0.5 picofarads (pF), the five substantially similar sized capacitors 204-212 would need to each be sized 5× larger (than a single equivalent capacitor) to have a capacitance value of 2.5 pF. Because each capacitor is 5× larger, parasitic effects can be minimized and tolerances improved yielding higher quality capacitors. For example, by distributing larger capacitors along the span distance rather than a single capacitor, parasitic inductance and resistance can be greatly reduced. Furthermore, by minimizing these parasitic effects, resonance can be achieved with greater accuracy.

Figure 3:
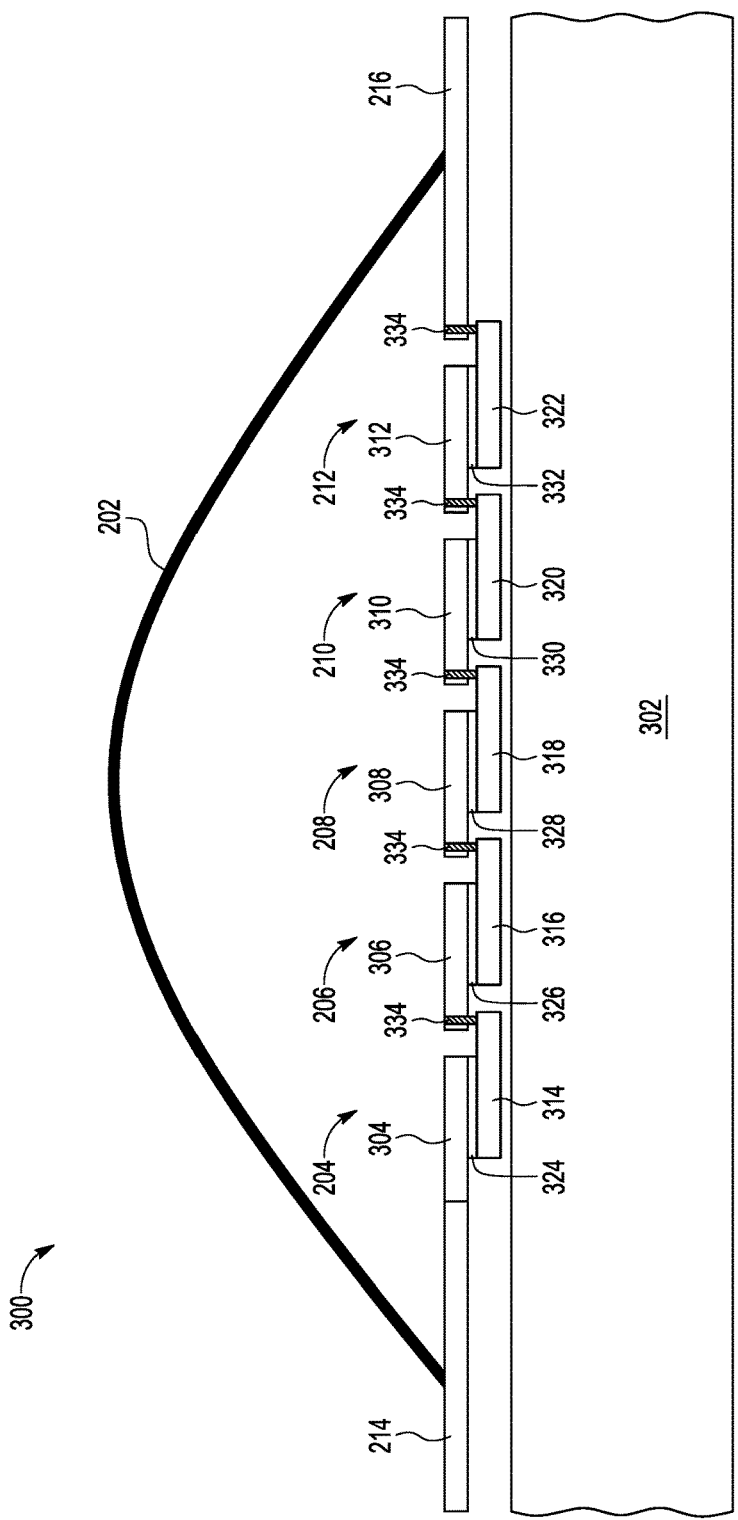
FIG. 3 illustrates, in a cross-sectional view, exemplary device layout of parallel LC resonator in accordance with an embodiment of the present disclosure.

FIG. 3 illustrates, in cross-sectional view form, exemplary parallel LC resonator layout 200 in accordance with an embodiment of the present disclosure. Resonator cross-sectional layout 300 depicts a cross-sectional view of the LC resonator layout 200 of FIG. 2. Resonator cross-sectional layout 300 includes inductor 202 formed from a bond wire coupled in parallel with series connected plurality of capacitors (204-212) over substrate 302. The first end of the bond wire is attached at first bonding pad 214 corresponding to input terminal IN and the second end of the bond wire is attached at second bonding pad 216 corresponding to output terminal OUT. The bond wire may be attached to bonding pads with either ball bonds or wedge bonds or a combination of ball bonds and wedge bonds. Bond wire of inductor 202 may be formed from any suitable conductive material such as aluminum, copper, silver, gold, and alloys thereof. Bond wire of inductor 202 may have a diameter in a range of 0.5 mils to 2.0 mils. Inductor 202 may be formed having any suitable span distance and loop height, corresponding to a desired inductance value. The term span distance, as used herein, refers to a straight line distance measured approximately from a first attachment location of the bond wire at the first bonding pad 214 to a second attachment location of the bond wire at the second bonding pad 216. The term loop height, as used herein, generally refers to a vertical distance measured approximately from a top metal layer (e.g., bonding pad metal layer) to a highest point of the bond wire arc or loop above the top metal layer. For example, it may be desirable for inductor 202 to have an inductance value of 1.4 nH. To achieve the value of 1.4 nH, an aluminum bond wire will have a diameter of approximately 1.5 mils, a span distance of approximately 35 mils, and a loop height of approximately 30 mils.

The plurality of capacitors includes five capacitors 204-212 connected in series, and arranged and distributed to substantially span the distance between the first attachment location and the second attachment location. In this embodiment, capacitors 204-212 are formed as metal-insulator-metal (MIM) capacitors. Each MIM capacitor 204-212 includes a bottom plate 314-322 formed from a first metal layer over substrate 302, and a top plate 304-312 formed from a second metal layer formed over the first metal layer. The top and bottom plates of each MIM capacitor are separated by a dielectric material 324-332. MIM capacitors 204-212 may be formed from any two different metal layers separated by one or more dielectric layers. The metal layers of MIM capacitors 204-212 may be formed from a variety of electrically conductive materials including, for example, copper, gold, silver, aluminum, nickel, tungsten, and alloys thereof. The one or more dielectric layers may be formed from a wide range of materials used for interlayer dielectrics, for example, including silicon dioxide, silicon nitride, silicon oxy-nitride, or any combination of such layers providing electrical isolation.

Capacitor 204 includes top plate 304 and bottom plate 314 separated by dielectric 324. The top plate 304 of capacitor 204 is connected at bonding pad 214 (IN terminal) and the bottom plate 314 of capacitor 204 is connected to top plate 306 of capacitor 206 by way of vias 334. The top plate 306 and bottom plate 316 of capacitor 206 are separated by dielectric 326, and the bottom plate 316 of capacitor 206 is connected to top plate 308 of capacitor 208 by way of vias 334. The top plate 308 and bottom plate 318 of capacitor 208 are separated by dielectric 328, and the bottom plate 318 of capacitor 208 is connected to top plate 310 of capacitor 210 by way of vias 334. The top plate 310 and bottom plate 320 of capacitor 210 are separated by dielectric 330, and the bottom plate 320 of capacitor 210 is connected to top plate 312 of capacitor 212 by way of vias 334. The top plate 312 and bottom plate 322 of capacitor 212 are separated by dielectric 332, and the bottom plate 322 of capacitor 212 is connected at bonding pad 216 (OUT terminal) by way of vias 334.

Because five similarly formed and sized capacitors 204-212 are connected in series, an equivalent capacitance between the first bonding pad 214 and the second bonding pad 216 may be substantially one-fifth of the capacitance of the individual capacitors of the plurality. For example, to achieve a desired equivalent capacitance value of 0.5 picofarads (pF), the five similarly formed capacitors 204-212 would need to each be sized 5× larger (than a single equivalent capacitor) to have a capacitance value of 2.5 pF. Because each capacitor is 5× larger, parasitic effects can be minimized yielding higher quality capacitors. For example, by distributing larger capacitors along the span distance rather than a single capacitor, parasitic inductance and resistance can be greatly reduced. Furthermore, by minimizing these parasitic effects, resonance can be achieved with greater accuracy.

In some embodiments, the plurality of capacitors connected in series can be configured to effectively eliminate vias in the capacitor connections when the plurality includes an even number of series connected capacitors. Considering an example having four capacitors connected in series, each capacitor of the plurality includes a bottom plate formed from a first metal layer, and a top plate formed from a second metal layer. In this example, the top plate of the first capacitor is connected at the IN terminal bonding pad and the bottom plate of the first capacitor is connected to a bottom plate of a second capacitor. The top plate of the second capacitor is connected to a top plate of a third capacitor. The bottom plate of the third capacitor is connected to a bottom plate of a fourth capacitor. And a top plate of the fourth capacitor is connected at the OUT terminal bonding pad. The top plate of each capacitor of the plurality is separated from its respective bottom plate by a dielectric.

The resonator layout views of FIG. 2 and FIG. 3 depict an implementation of a resonator circuit according to an embodiment of the present disclosure. The inductor 202 and series capacitors 204-212 have values tuned to a desired resonance. In this embodiment, inductor 202 is formed to have a value of 1.4 nH and series capacitors 204-212 are formed to each have a value of 2.5 pF, having an equivalent capacitance for the series as 0.5 pf. The parallel combination yields a 6 GHz open circuit LC tank resonance. Any other resonant frequency can be realized by appropriate sizing of inductor and series capacitor. Any number larger capacitors coupled in series can be distributed along the span distance rather than a smaller single capacitor, reducing parasitic effects and improving efficiency. Each capacitor in the series may be formed in a size different from other capacitors in the series. For example, it may be desirable to form a plurality of N number of series connected capacitors to be distributed along the span distance where first and second capacitors are coupled to the input and output pads respectively. In this example, first and second capacitors can be formed as a different size (e.g., larger) than the remaining N−2 capacitors coupled in series between the first and second capacitors.

Generally, there is provided, an integrated circuit including (IC) including: an input pad; an output pad separated from the input pad by a predetermined distance; a plurality of capacitors coupled in series between the input pad and the output pad, the plurality of capacitors distributed to substantially span the predetermined distance; and an inductor formed from a bond wire, a first end of the bond wire attached at the first input pad and a second end of the bond wire attached at the output pad, the inductor and plurality of capacitors configured to form a predetermined open circuit resonance. Each capacitor in the plurality may have a first plate formed from a first metal layer and a second plate formed from a second metal layer over the first metal layer. The plurality of capacitors may be characterized as metal-insulator-metal (MIM) capacitors having a dielectric insulator formed from a nitride material. The predetermined distance may be substantially in a range of 30 to 40 mils, and a loop height of the bond wire is substantially in a range of 25 to 35 mils. The bond wire may include an aluminum or copper material. The bond wire may have a diameter substantially in a range of 0.5 to 2.5 mils. The plurality of capacitors may include five substantially equal sized capacitors connected in series. The inductor and plurality of capacitors may be configured to form a 6 GHz open resonant frequency. The input pad, output pad, inductor, and plurality of capacitors may be formed over a common semiconductor substrate. The substrate may be formed from a gallium-arsenide or silicon material.

In another embodiment, there is provided, an integrated passive device (IPD) including: an input pad formed over a substrate; an output pad formed over the substrate, the output pad separated from the input pad by a predetermined distance; a plurality of capacitors coupled in series between the input pad and the output pad, each capacitor of the plurality having a first plate formed from a first metal layer over the substrate and a second plate formed from a second metal layer over the first metal layer; and an inductor formed from a bond wire, a first end of the bond wire attached at the first input pad and a second end of the bond wire attached at the output pad, the inductor and plurality of capacitors configured to form a predetermined resonance. The plurality of capacitors coupled in series between the input pad and the output pad may be distributed to substantially span the predetermined distance. The predetermined distance may be substantially in a range of 30 to 40 mils, and a loop height of the bond wire is substantially in a range of 25 to 35 mils. Each capacitor of the plurality may include a dielectric insulator formed between the first plate and the second plate, the dielectric insulator including a nitride material. The bond wire may include at least a material selected from the group consisting of aluminum, copper, silver, and gold. The plurality of capacitors may include N number of capacitors coupled in series, wherein: a first capacitor of the plurality having a first terminal coupled to the input pad; a second capacitor of the plurality having a first terminal coupled to the output pad; and N−2 capacitors coupled in series between second terminals of the first and second capacitors. The integrated passive device wherein N equals five (N=5), and wherein the first and second capacitors may be formed to be larger than the N−2 (3) capacitors coupled in series between second terminals of the first and second capacitors.

In yet another embodiment, there is provided, a method including: forming an inductor from a bond wire, attaching a first end of the bond wire to a first input pad and a second end of the bond wire to an output pad, the input pad and output pad formed over a substrate; and coupling in parallel a plurality of capacitors with the inductor, the plurality of capacitors connected in series between the input pad and the output pad, each capacitor of the plurality having a first plate formed from a first metal layer over the substrate and a second plate formed from a second metal layer over the first metal layer, the inductor and plurality of capacitors configured to form a predetermined resonance. The output pad may be separated from the input pad by a predetermined distance, and wherein the plurality of capacitors may be distributed to substantially span the predetermined distance. The method may further include forming a dielectric insulator between the first plate and the second plate of each capacitor of the plurality, the dielectric insulator including a nitride material.

By now it should be appreciated that there has been provided, a parallel LC resonant tank circuit. The inductive and capacitive components of the LC resonator have values tuned to a desired resonance. An inductor is formed from a bond wire coupled to an input pad and an output pad separated from the input pad by a predetermined distance. A plurality of capacitors are coupled in series between the input pad and output pad forming a parallel LC arrangement. The series capacitors are distributed to substantially span the predetermined distance. By arranging the capacitors in series, each capacitor can be physically larger thus minimizing parasitic effects and achieving resonance with greater accuracy.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit (IC) comprising:
   an input pad;
   an output pad separated from the input pad by a predetermined distance;
   a plurality of capacitors coupled in series between the input pad and the output pad, the plurality of capacitors distributed to substantially span the predetermined distance, the plurality of capacitors including a first capacitor and a second capacitor, the second capacitor larger than the first capacitor; and
   an inductor formed from a bond wire, a first end of the bond wire attached at the input pad and a second end of the bond wire attached at the output pad, the inductor and plurality of capacitors configured to form a predetermined open circuit resonance.

2. The integrated circuit of claim 1, wherein each capacitor in the plurality has a first plate formed from a first metal layer and a second plate formed from a second metal layer over the first metal layer.

3. The integrated circuit of claim 1, wherein the plurality of capacitors are characterized as metal-insulator-metal (MIM) capacitors having a dielectric insulator formed from a nitride material.

4. The integrated circuit of claim 1, wherein the predetermined distance is substantially in a range of 30 to 40 mils, and a loop height of the bond wire is substantially in a range of 25 to 35 mils.

5. The integrated circuit of claim 1, wherein the bond wire includes an aluminum or copper material.

6. The integrated circuit of claim 1, wherein the bond wire has a diameter substantially in a range of 0.5 to 2.5 mils.

7. The integrated circuit of claim 1, wherein the inductor and plurality of capacitors are configured to form a 6 GHz open resonant frequency.

8. The integrated circuit of claim 1, wherein the input pad, output pad, inductor, and plurality of capacitors are formed over a common semiconductor substrate.

9. The integrated circuit of claim 8, wherein the substrate is formed from a gallium-arsenide or silicon material.

10. An integrated passive device (IPD) comprising:
    an input pad formed over a substrate;
    an output pad formed over the substrate, the output pad separated from the input pad by a predetermined distance;
    a plurality of capacitors coupled in series between the input pad and the output pad, each capacitor of the plurality having a first plate formed from a first metal layer over the substrate and a second plate formed from a second metal layer over the first metal layer, the plurality of capacitors including a first capacitor and a third capacitor, the first capacitor larger than the third capacitor; and
    an inductor formed from a bond wire, a first end of the bond wire attached at the input pad and a second end of the bond wire attached at the output pad, the inductor and plurality of capacitors configured to form a predetermined resonance.

11. The integrated passive device of claim 10, wherein the bond wire includes at least a material selected from the group consisting of aluminum, copper, silver, and gold.

12. The integrated passive device of claim 10, wherein the plurality of capacitors coupled in series between the input pad and the output pad are distributed to substantially span the predetermined distance.

13. The integrated passive device of claim 10, wherein the predetermined distance is substantially in a range of 30 to 40 mils, and a loop height of the bond wire is substantially in a range of 25 to 35 mils.

14. The integrated passive device of claim 10, wherein each capacitor of the plurality includes a dielectric insulator formed between the first plate and the second plate, the dielectric insulator including a nitride material.

15. The integrated passive device of claim 10, wherein the plurality of capacitors includes N number of capacitors coupled in series, wherein:
    the first capacitor of the plurality having a first terminal coupled to the input pad;
    a second capacitor of the plurality having a first terminal coupled to the output pad; and
    N−2 capacitors coupled in series between second terminals of the first and second capacitors.

16. The integrated passive device of claim 15, wherein N equals five (N=5), and wherein the first and second capacitors are formed to be larger than the N−2 (3) capacitors coupled in series between second terminals of the first and second capacitors.

17. A method comprising:
    forming an inductor from a bond wire, attaching a first end of the bond wire to a first input pad and a second end of the bond wire to an output pad, the input pad and output pad formed over a substrate; and
    coupling in parallel a plurality of capacitors with the inductor, the plurality of capacitors connected in series between the input pad and the output pad, each capacitor of the plurality having a first plate formed from a first metal layer over the substrate and a second plate formed from a second metal layer over the first metal layer, the inductor and plurality of capacitors configured to form a predetermined resonance the plurality of capacitors including a first capacitor and a second capacitor, the second capacitor larger than the first capacitor.

18. The method of claim 17, further comprising forming a dielectric insulator between the first plate and the second plate of each capacitor of the plurality, the dielectric insulator including a nitride material.

19. The method of claim 17, wherein the output pad is separated from the input pad by a predetermined distance, and wherein the plurality of capacitors is distributed to substantially span the predetermined distance.

* * * * *